United States Patent [19]

Sawamura

[11] 4,320,936

[45] Mar. 23, 1982

[54] FAR ULTRAVIOLET DIELECTRIC MULTILAYER FILM

[75] Inventor: Mitsuharu Sawamura, Yokohama, Japan

[73] Assignee: Canon Kabushiki Kaisha, Tokyo, Japan

[21] Appl. No.: 79,083

[22] Filed: Sep. 26, 1979

[30] Foreign Application Priority Data

Sep. 27, 1978 [JP] Japan .................. 53-118757

[51] Int. Cl.³ .................... G02B 5/28; G02B 5/22
[52] U.S. Cl. ........................ 350/1.6; 350/166
[58] Field of Search .......... 350/1.6, 1.7, 164, 166, 350/288, 290, 299

[56] References Cited

U.S. PATENT DOCUMENTS 3,247,392 4/1966 Thelen ........................ 350/1.6
3,853,386 12/1974 Ritter et al. .................. 350/288

OTHER PUBLICATIONS

Aleksandrou, U. A. et al., "Optical Properties of Zirconium Dioxide in the Infrared Region", Opt. Spectrose, vol. 40, No. 6, Jun. 1978, pp. 627-628.
So, S. S. et al., "Optical Constants of Silicon at 5461 A", JOSA, vol. 62, No. 4, Apr. 1972, pp. 596-598.

Primary Examiner—John K. Corbin
Assistant Examiner—Bruce Y. Arnold
Attorney, Agent, or Firm—Fitzpatrick, Cella, Harper & Scinto

[57] ABSTRACT

A far ultraviolet dielectric multilayer film is disclosed which is composed of a first group of films on a substrate and a second group of films overlaid on the first group of films. The first group of films comprises alternate layers of a high refractive index dielectric which absorbs rays in the ultraviolet region and a low refractive index dielectric. The second group of films comprises alternate layers of an intermediate refractive index dielectric which does not absorb rays in ultraviolet region and a low refractive index dielectric.

5 Claims, 21 Drawing Figures

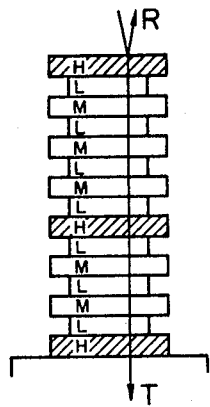 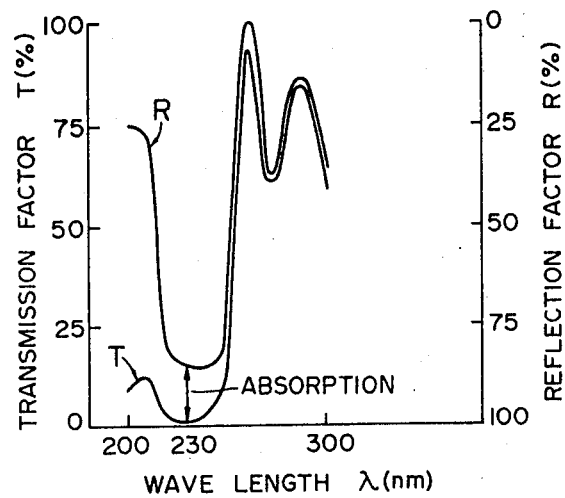
FIG. 13A  FIG. 13B
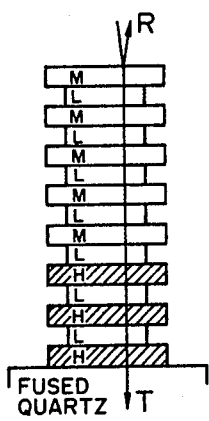 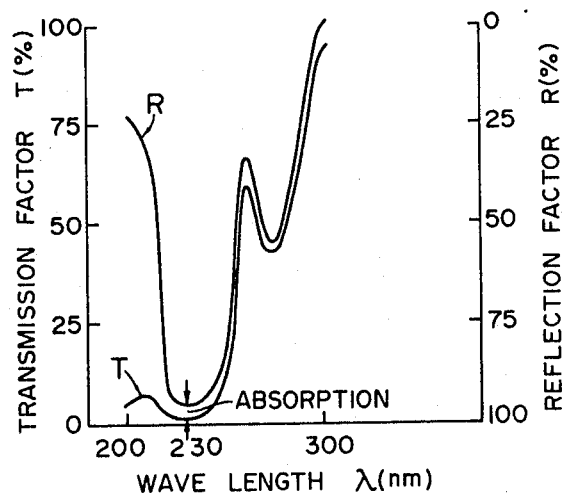
FIG. 14A  FIG. 14B

FAR ULTRAVIOLET DIELECTRIC MULTILAYER FILM

BACKGROUND OF THE INVENTION

1. Field of the Invention

The present invention relates to a far ultraviolet dielectric multilayer film which reflects beams in the far ultraviolet region and transmits beams in other wavelength regions.

2. Description of the Prior Art

At present, with development of super LSI, attention in this technical field is directed to X-ray lithography, electron beam lithography and deep ultraviolet lithography. Particularly of interest is a far ultraviolet exposure method which is a kind of transfer lithography employing ultraviolet rays of wavelength ranging from 200 to 300 nm and which was developed on the basis of known techniques of photolithography. According to the method it is possible to transfer a very fine pattern less than 1μ.

Printing on photoresist is carried out using a mirror illumination system in which an Xe-Hg lamp is used as a light source. The mirror used in the illumination system is prepared by vapor deposition of aluminum and magnesium fluoride. However, since the mirror has a high reflectance to such beam of light having a wavelength longer than 200 nm, an undue rise of temperature is caused in the silicon wafer, which results in reduction of accuracy of the transferred pattern.

As for a multilayer film which reflects effectively far ultraviolet beams of light in the wavelength region of 200 to 250 nm but transmits beams of light longer than 250 nm, there has been known one such film which comprises alternate high refractive index and low refractive index layers with thorium oxide being used in the high refractive index layer. Thorium oxide absorbs almost no beams of light in the far ultraviolet region and therefore it causes no reduction of reflection power. On the contrary, high refractive dielectric substances other than thorium oxide generally absorb far ultraviolet rays, thereby reducing reflection power. This is the reason why thorium oxide is used in the high refractive index layer of such known multilayer film. However, thorium oxide is radioactive and its use in such multilayer film involves some problems. Therefore, it is desirable that use of thorium oxide be avoided.

To achieve high reflectance to far ultraviolet beams of light without any problem it has also been proposed to use a non-absorptive intermediate refractive index film ($ThF_4$, $Al_2O_3$, $BaF_2$) instead of the above mentioned high refractive dielectric film. In this case, the multilayer film is composed of alternate intermediate refractive index and low refractive index layers. However, with this arrangement of multilayer film, a satisfactorily high reflection power can be obtained only when a large number of layers such as 20-30 layers are used. This makes the manufacture of such a multilayer film very difficult. In addition, the reflection band width becomes narrowed. A desirable width of reflection band may be attained only with much difficulty.

SUMMARY OF THE INVENTION

Accordingly, it is an object of the invention to provide a far ultraviolet multilayer film which is able to effectively reflect beams of light in far ultravoilet region, primarily those in the wavelength of 200 to 250 nm but transmits beams of light in other regions of wavelength.

It is another object of the invention to provide a far ultraviolet multilayer film which is able to reflect far ultraviolet beams of light at high power and which has an adequate width of reflection band.

It is a further object of the invention to provide a far ultraviolet multilayer film which is easy to manufacture.

According to the invention the above objects are attained by arranging high refractive index dielectric layers which absorb light in the ultraviolet region, intermediate refractive index dielectric layers which do not absorb light in the ultraviolet region and a low refractive index dielectric layer in an inventive manner. Namely, on a substrate there is placed a first group of films comprising alternate high refractive index dielectric and low refractive index dielectric layers and then on the first group there is overlaid a second group of films comprising alternate intermediate refractive index dielectric and low refractive index dielectric layers. The high refractive index dielectric is one which absorbs light in ultraviolet region whereas the intermediate and low refractive index ones exhibit no absorption of light in ultraviolet region.

The first film group is provided to sufficiently broaden the half width of the reflection band in the far ultraviolet region. To minimize the adverse effect of absorption caused by the high refractive index layer, the latter is disposed on the side of substrate according to the invention.

In a far ultraviolet multilayer film according to the invention, the bottom-most layer of the first group which is in contact with the substrate is preferably a high refractive index dielectric layer. The bottom-most layer of the second group which is in contact with the first group may be a low refractive index layer or an intermediate refractive index layer. However, when the topmost layer of the first group is a low refractive index layer, the bottom-most layer of the second group should be an intermediate refractive index layer. The topmost layer of the second group that is the furthermost layer from the substrate may be an intermediate refractive index layer or a low refractive index layer.

For the purpose of this specification, the term "high refractive index" is used to indicate a refractive index not less than 1.9 and "low refractive index" to indicate a refractive index not more than 1.5. An intermediate refractive index is one lying between 1.5 and 1.9.

Examples of the high refractive dielectric layer used in the invention include $ZrO_2$, $TiO_2$, $CeO_2$ and ZnS, which absorb light in the ultraviolet region. Examples of the intermediate refractive index dielectric which do not absorb light in the ultraviolet region are $Al_2O_3$, $BaF_2$, MgO and SiO. Examples of the low refractive index dielectric which do not absorb light in the ultraviolet region include $SiO_2$, $MgF_2$, $Na_3AlF_6$ and $CaF_2$.

Other features and advantages of the invention will be apparent from the following description taken in connection with the accompanying drawings.

DESCRIPTION OF THE PREFERRED EMBODIMENTS

Figure 1:
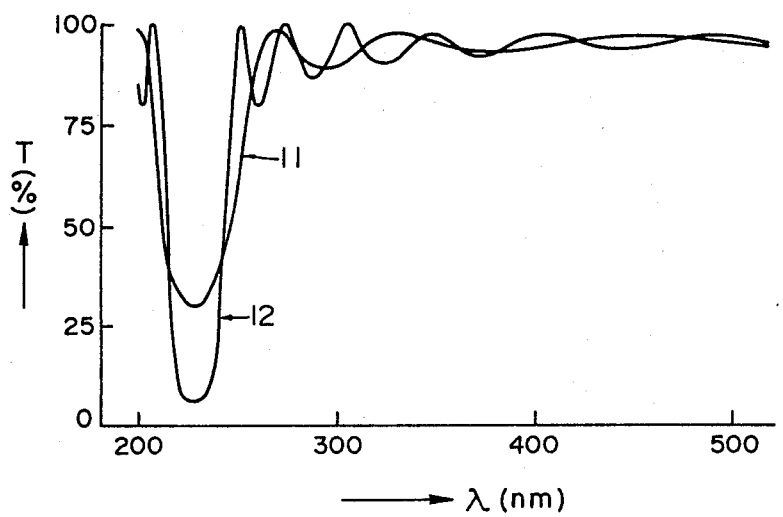
FIG. 1 shows characteristic curves of ultraviolet multilayer films each comprising alternate intermediate refractive index dielectric and low refractive index dielectric layers.

FIG. 1 shows transmission characteristic curves 11 and 12 of multilayer films having a reflection band in the ultraviolet region. The multilayer films comprise alternate low refractive index and intermediate refractive index layers. In FIG. 1, the transmission factor T is taken on the ordinate and the wavelength on the abscissa. As an intermediate refractive dielectric substance there is used aluminum oxide, as a low refractive substance magnesium is fluoride used and as a substrate there is used fused quartz. Of the two characteristic curves shown in FIG. 1 the curve 11 is obtained from the above mentioned type of multilayer film which is composed of eleven layers and the curve 12 is obtained from one which is composed of twenty one layers. The incident angle of light to the film is normal to the surface of the film in each case. Arrangements of the films used for curves 11 and 12 are shown in the following Table 1.

TABLE 1

| Curve 11 Substrate(fused quartz) - (M L)⁵M - Air |
| Curve 12 Substrate(fused quartz) - (M L)¹⁰M - Air |

In the above table, M is a layer of aluminum oxide and L is a layer of magnesium fluoride. The optical film thickness of the respective layers (M, L) is $\lambda_o/4$ wherein $\lambda_o$ is the fundamental wavelength which is, in this case, set as $\lambda_o = 230$ nm.

Experimentally it is found that the dispersion formula of $n = 1.61 + 9/(\lambda - 140)$ is applicable for the refractive index of aluminum oxide, $n = 1.37 + 7/(\lambda - 120)$ for that of magnesium fluoride and $n = 1.45 + 8/(\lambda - 130)$ for fused quartz respectively.

As may be clearly seen from FIG. 1, for the multilayer film composed of a combination of intermediate refractive index and low refractive index layers, the reflection factor which is attained by the arrangement of eleven (11) layers is only 70%. By increasing the number of layers up to twenty one (21) the reflection factor can be increased up to a value of more than 90%. However, the half width is narrow and is only about 30 nm. With such a narrow half width it is impossible to obtain a satisfactory reflection band in the far ultraviolet region.

To broaden the reflection band according to the invention, it is proposed to use a high refractive dielectric layer which absorbs light in the far ultraviolet region.

To assist in a better understanding of the invention, hereinafter, a description will be made as to the characteristics which such dielectric having absorption of far ultraviolet wavelength generally possess. For the sake of explanation zirconium oxide is employed as an example of a high refractive dielectric substance used in the invention.

Figure 2:
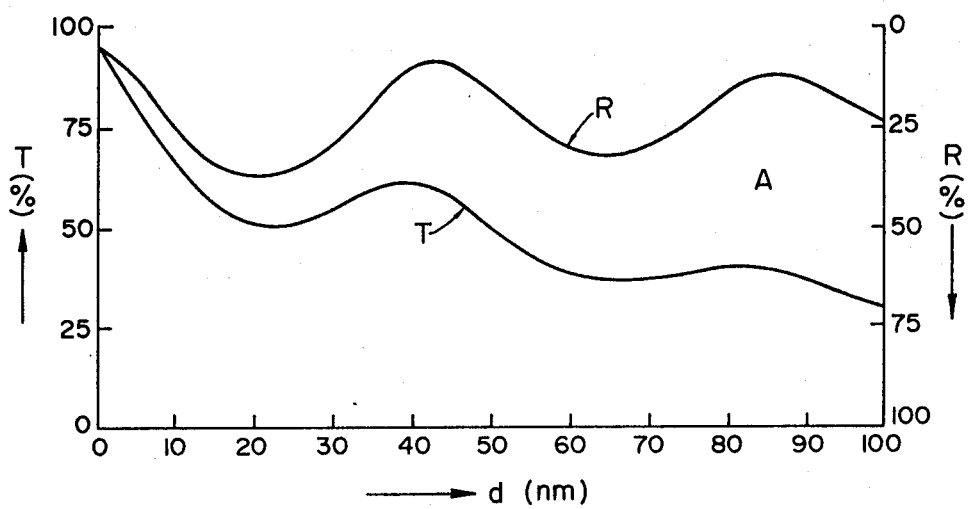
FIG. 2 shows the characteristics of a zirconium oxide monolayer with respect to film thickness.

FIG. 2 is a correlation curve between the optical property versus film thickness of a zirconium monolayer film at wavelength of 230 nm. Changes in the reflection factor R, transmission factor T and absorption factor A relative to geometrical film thickness d are plotted in FIG. 2 with the reflection factor R and the transmission factor T as the ordinate and the film thickness d as the abscissa.

Figure 3:
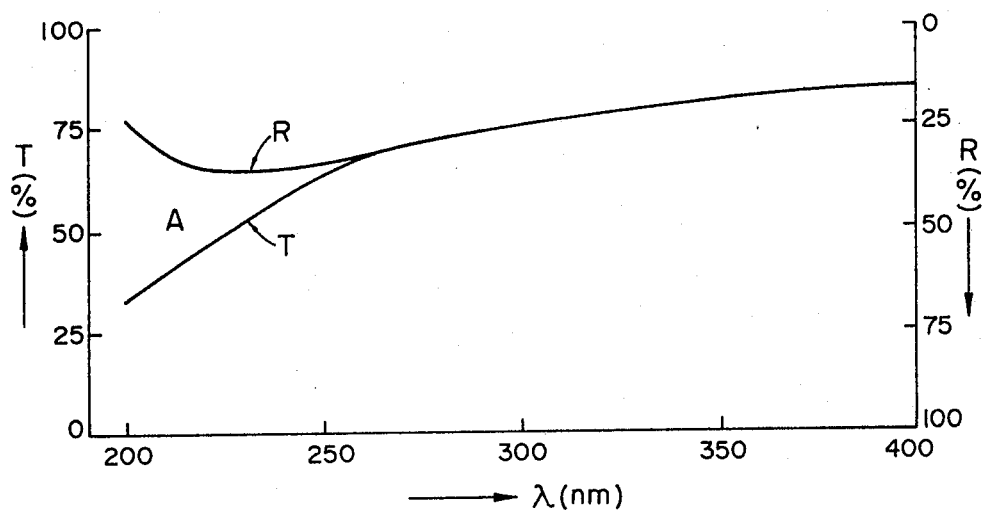
FIG. 3 is the characteristic curve of a zirconium oxide monolayer.

FIG. 3 is a correlation curve between the optical property (reflection factor R, transmission factor T and absorption factor A) and wavelehgth $\lambda$ of the same zirconium oxide film whose film thickness was fixed to 25 nm. Changes in R, T and A are plotted relative to the wavelength $\lambda$ on abscissa. Refractive indexes of the zirconium oxide n-ik to various values of wavelength $\lambda$ are shown in Table 2. k is the absorption coefficient.

TABLE 2

| Wavelength nm | n | R | Wavelength nm | n | R | Wavelength nm | n | R |
|---|---|---|---|---|---|---|---|---|
| 200 | 3.49 | 0.50 | 270 | 2.34 | 0.01 | 340 | 2.16 | 0.0 |
| 210 | 3.04 | 0.37 | 280 | 2.30 | 0.01 | 350 | 2.15 | 0.0 |
| 220 | 2.80 | 0.26 | 290 | 2.27 | 0.01 | 360 | 2.14 | 0.0 |
| 230 | 2.64 | 0.16 | 300 | 2.24 | 0.01 | 370 | 2.13 | 0.0 |
| 240 | 2.53 | 0.08 | 310 | 2.22 | 0.0 | 380 | 2.12 | 0.0 |
| 250 | 2.45 | 0.03 | 320 | 2.20 | 0.0 | 390 | 2.11 | 0.0 |
| 260 | 2.39 | 0.01 | 330 | 2.18 | 0.0 | 400 | 2.10 | 0.0 |

Hereinafter, the refractive index n-ik of zirconium oxide is considered to vary in accordance with the above Table 2.

From FIG. 2 it is seen that the absorption factor increases gradually with the increase of the film thickness d and that when the film thickness d is sufficiently large, the transmission factor T reaches 0 and the reflection factor reaches about 20.5% which corresponds to reflection only upon the interface between the film and air. When the fundamental wavelength is 230 nm, the absorption factor is 12% and the reflection factor is 37% for the geometrical film thickness of 22 nm ($22.0 \times 2.64 \approx 58$) corresponding to ¼ wavelength film thickness (57.5 nm) as shown in FIG. 2.

From FIG. 3, it is seen that when wavelength was less than 250 nm where the absorption coefficient k gradually increased, the absorption A also increased gradually with decrease of wavelength and that at a wavelength near 200 nm the absorption factor exceeded 40%.

Figure 4:
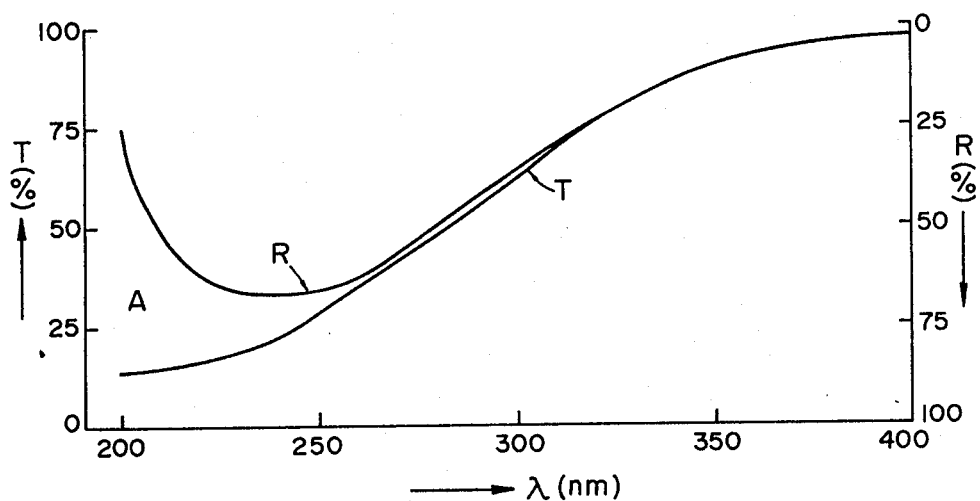
FIGS. 4 to 7 show wavelength characteristics of various multilayer films of the type which comprises alternate layers of zirconium oxide as a high refractive index layer and magnesium fluoride as a low refractive index layer.
Figure 5:
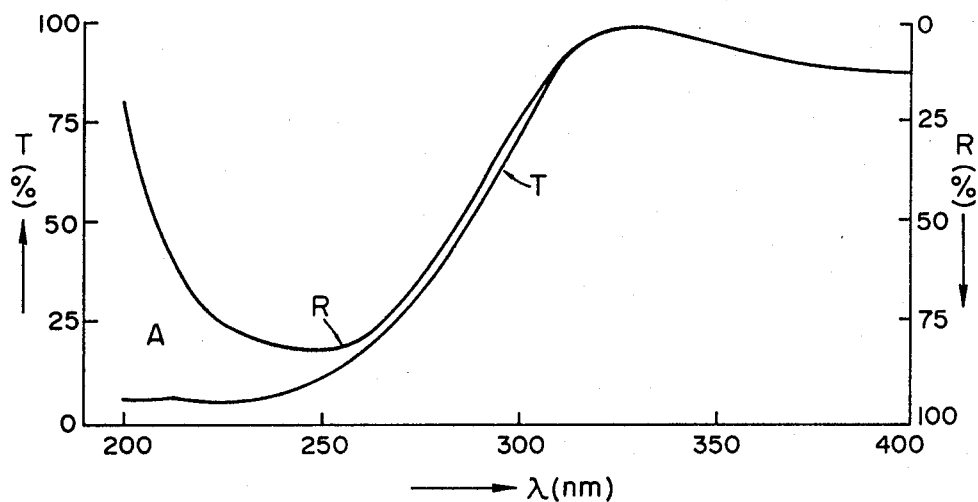
Figure 6:
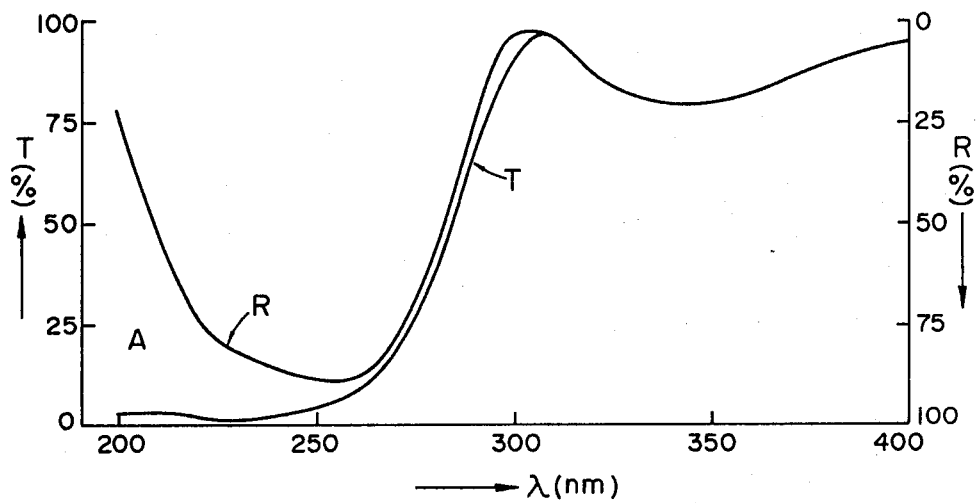
Figure 7:
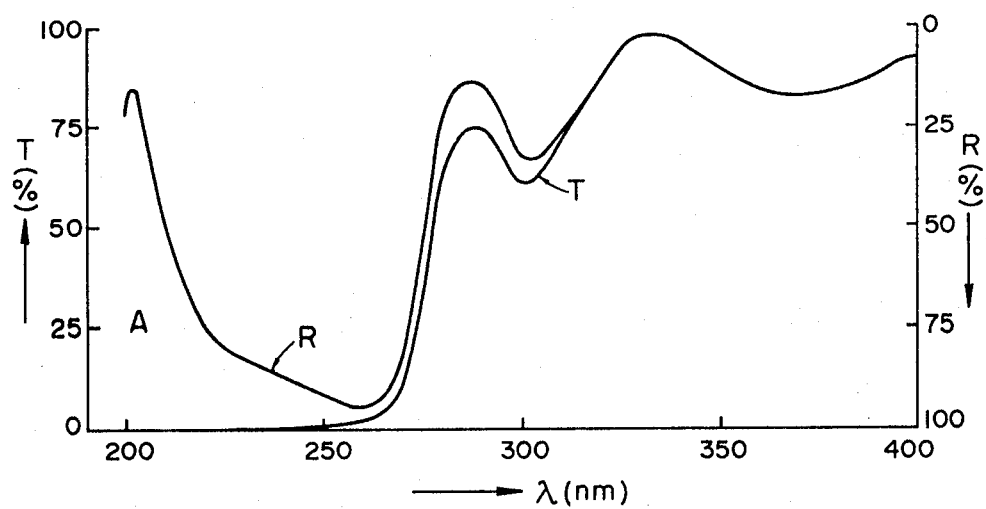

Now, let us consider the case of a combination of a high refractive index dielectric layer and a low refractive index dielectric layer. FIGS. 4 to 7 show the changes of reflection factor, transmission factor and absorption factor with the increase of number of layers in such combination in which zirconium oxide is used to form the high refractive dielectric layers and magnesium fluoride to form the low refractive dielectric layers. FIG. 4 is a characteristic curve obtained from such a multilayer film containing three layers, FIG. 5 is for five layers, FIG. 6 is for seven layers and FIG. 7 is for eleven layers arranged in the manner shown in the following Table 3. As the substrate there was used quartz and the angle of incidence was zero (0) degrees in every case.

TABLE 3

| Curve 41 (FIG. 4) Substrate (quartz) - (HL)H - Air |
| Curve 51 (FIG. 5) Substrate (quartz) - $(HL)^2H$ - Air |
| Curve 61 (FIG. 6) Substrate (quartz) - $(HL)^3H$ - Air |
| Curve 71 (FIG. 7) Substrate (quartz) - $(HL)^5H$ - Air |

In the above table, H stands for a layer of zirconium oxide and L for a layer of magnesium fluoride. The optical film thickness measured at the wavelength of 230 nm was 60 nm for both H and L.

Reviewing FIGS. 4 through 7 while paying particular respect to the wavelength of 230 nm it will be seen that the reflection factor R increases gradually with increase in the number of alternate layers (66% for three layers, 78% for five layers, 82% for seven layers and 83% for eleven layers) but the absorption factor A remains almost unchanged (see the values of 15%, 16%, 16% and 17% for the above mentioned four cases).

Figure 8:
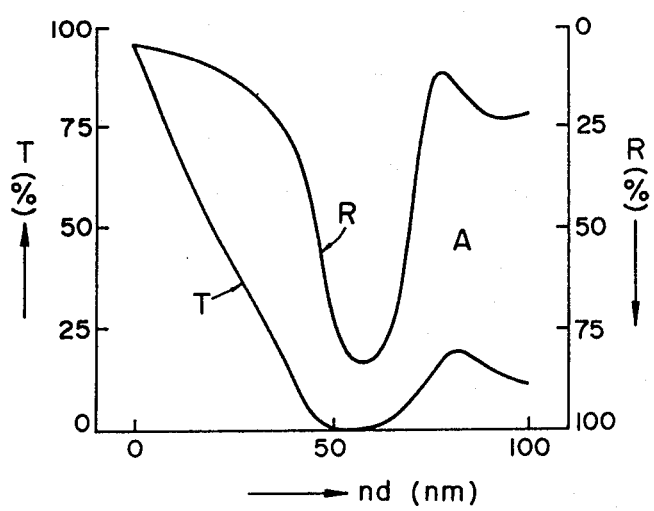
FIG. 8 is a characteristic curve relative to film thickness of the same type of multilayer film.

In another incubation, a multilayer film containing eleven alternate layers the arrangement of which corresponds to that of FIG. 7, is altered in its layer thickness in the range of from 0 to 100 nm with all eleven layers are of equal thickness. FIG. 8 shows the changes in the reflection factor, transmission factor and absorption factor of the film relative to the change in optical film thickness of the respective layers at 230 nm in wavelength.

From FIG. 8 it is seen that, considering the wavelength of 230 nm to be a fundamental wavelength, the reflection factor R is at its maximum when the film thickness is at a value near ¼ of the fundamental wavelength, that is, 7.5 nm. Also, it is seen that the absorption factor A at first increases gradually with the increase of film thickness, then it decreases as the film thickness approaches ¼ of the fundamental wavelength and after the film thickness exceeds the point of ¼ wavelength the absorption factor A again begins to increase gradually with the increase of the film thickness.

From the above it is concluded that even when there are used high refractive and absorbing dielectric layers the reflection factor can be increased by increasing the number of layers as demonstrated in FIGS. 4 to 6, and that the absorption factor varies depending upon not only film thickness but also reflection factor R as demonstrated by FIG. 8. However, as indicated by the characteristic curves of FIGS. 6 and 7, the maximum reflection factor is limited by the value of the absorption coefficient k at a wavelength at that time. At the wavelength of 230 nm, the reflection factor reaches nearly its upper limit when the multilayer film is composed of seven layers. Almost no further increase of reflection factor can be attained by increasing the number of layers up to eleven.

Figure 9:
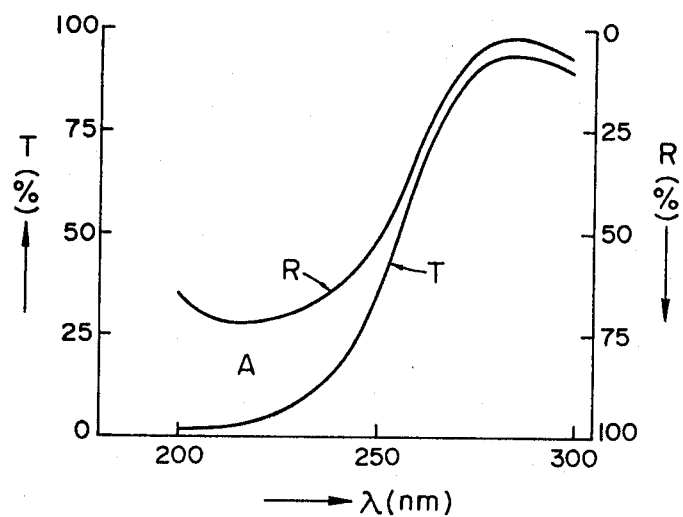
FIG. 9 shows a wavelength characteristic curve of the same type of multilayer film.

FIG. 9 shows a characteristic curve calculated from the same five layer arrangement as shown in FIG. 5 when the optical film thickness of the respective layers is 50 nm for a wavelength of 230 nm.

FIG. 9 indicates that the reflection factor of the multilayer film is at its maximum, 72% at the wavelength of 210 nm. No further increase of the reflection factor R is attainable even by increasing the number of layers.

Therefore, in the case where zirconium oxide is used as the high refractive index dielectric substance having absorption in the ultraviolet region and magnesium fluoride as the low refractive index dielectric substance having no absorption in the ultraviolet region to form the alternate layers of the multilayer film, the number of effective layers in the multilayer film constituting a reflection mirror to become smaller with larger absorption coefficient K at a certain particular wavelength, that is, fundamental wavelength. For the far ultraviolet region ranging from 200 to 250 nm, the number of effective layers is 5 or 7.

To further increase the reflection factor R according to the invention it is proposed to additionally provide alternate layers of an intermediate refractive index dielectric substance having no absorption of light in the ultraviolet region and a low refractive index dielectric substance on the above described alternate layers of high refractive dielectric substance and low refractive dielectric substance. This particular combination of layers according to the invention brings forth a particular effect as described hereinafter.

Figure 10:
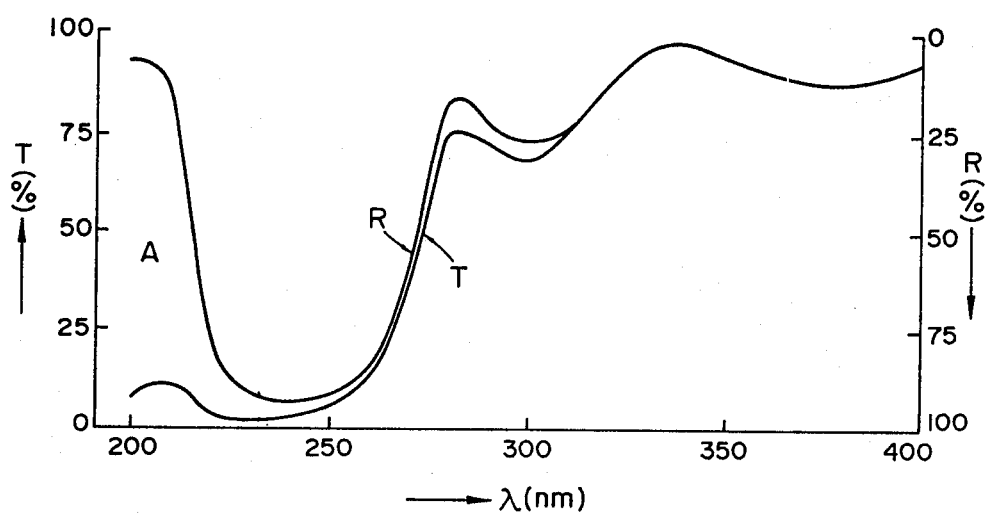
FIGS. 10 and 11 are wavelength characteristic curves of ultraviolet multilayer films according to the present invention respectively.

A characteristic curve which was obtained from one embodiment of the present invention is shown in FIG. 10. This embodiment comprised 11 (eleven) layers arranged on a quartz substrate. Arrangement of the layers which were used is as follows. The layers are numbered from the side of the substrate.

| Nos. 1, 3 and 5 | high refractive dielectric zirconium oxide layers |
| Nos. 7, 9 and 11 | intermediate refractive dielectric aluminum oxide layers |
| Nos. 2, 4, 6, 8 and 10 | low refractive dielectric magnesium fluoride layers |

The optical film thickness of the individual layers was the same and 60 nm at the wavelength of 230 nm. The above arrangement is equivalent to the five layer arrangement shown in FIG. 5 plus a six layer arrangement comprising aluminum oxide and magnesium fluoride alternate layers.

Comparing the characteristic curve of FIG. 10 with that of FIG. 5, it is evident that the reflection factor R can be improved by employing the arrangement of the invention. Also, comparing the characteristic curve of FIG. 10 with that of FIG. 1 (twenty one layers) it is evident that the half width can be broadened to a great extent by employing the arrangement of the invention.

In another experiment, a multilayer film according to the invention was prepared by employing the arrangement of FIG. 10 but altering the optical film thickness to 50 nm for a beam of light 230 nm in wavelength.

Figure 11:
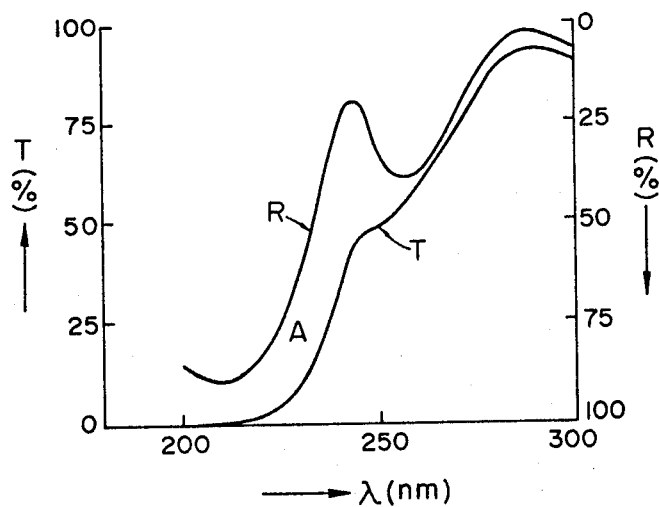

FIG. 11 shows a characteristic curve obtained from such a multilayer film. Compared with the characteristic curve of FIG. 9, the characteristic curve of FIG. 11 shows a remarkable improvement in reflection factor R at the wavelength of 210 nm.

According to the invention, the high refractive dielectric layers having absorption in the ultraviolet region are disposed adjacent the substrate to obtain the particular advantage of the present invention. The importance of this feature will be understood from the following description with reference to FIGS. 12 to 14.

Figure 12A:
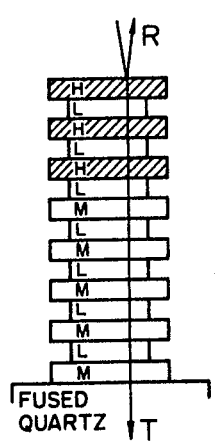
FIGS. 12 A-B, 13 A-B and 14 A-B illustrate the effect of the present invention.

The three arrangements shown in FIGS. 12A, 13A and 14A are similar in the respect that the number of layers contained therein is 11 (eleven) of which three are high refractive dielectric zirconium oxide layers H, five are intermediate refractive dielectric aluminum oxide layers M and seven are low refractive dielectric magnesium fluoride layers L. However, these three arrangements differ from each other according to the position in which the high refractive dielectric layers H are located.

In the arrangement shown in FIG. 12A, its three high refractive dielectric layers H are all disposed adjacent the medium through which light enters the multilayer film. In case of FIG. 13A arrangement, its three high refractive dielectric layers H are displaced apart such that one is adjacent the substrate, the second one is in the middle portion and the third one is at the side of the medium. In the arrangement shown in FIG. 14A and according to the invention, its three high refractive dielectric layers H were all disposed adjacent the substrate. The substrate is fused quartz for all the three cases and the optical film thickness to a beam of light of 230 nm in wavelength is 57.5 nm for all of the individual layers (H, M, L).

Figure 12B:
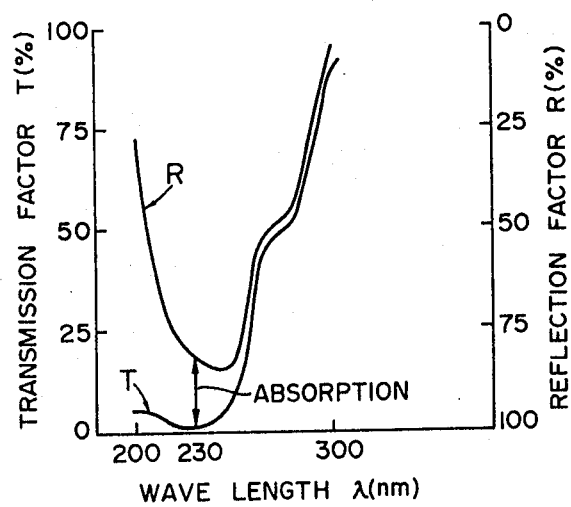

FIG. 12B is a characteristic curve calculated from the arrangement shown in FIG. 12A, 13B is a characteristic curve calculated from that of FIG. 13A and FIG. 14B shows a characteristic curve obtained by measurement from the arrangement shown in FIG. 14A. From these characteristic curves it is clearly seen that the arrangement of FIG. 14A in which the three high refractive dielectric layers H having an absorbing power are all disposed adjacent the substrate, had the highest reflection factor R at or near the fundamental wavelength of 230 nm and also the lowest absorption factor A. This demonstrates the advantage of the high refractive dielectric layers disposed at the side of the substrate.

FIG. 15 shows an embodiment of multilayer film for use in the ultraviolet region. This ultraviolet multilayer film had a particularly high reflection factor to light in the wavelength range of from 200 to 250 nm and a particularly high transmission factor in the range of from 250 nm to infrared region.

Figure 15A:
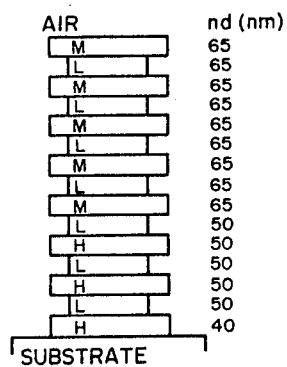
FIGS. 15A and B show the arrangement of an ultraviolet multilayer film according to the invention and the wavelength characteristic thereof.
Figure 15B:
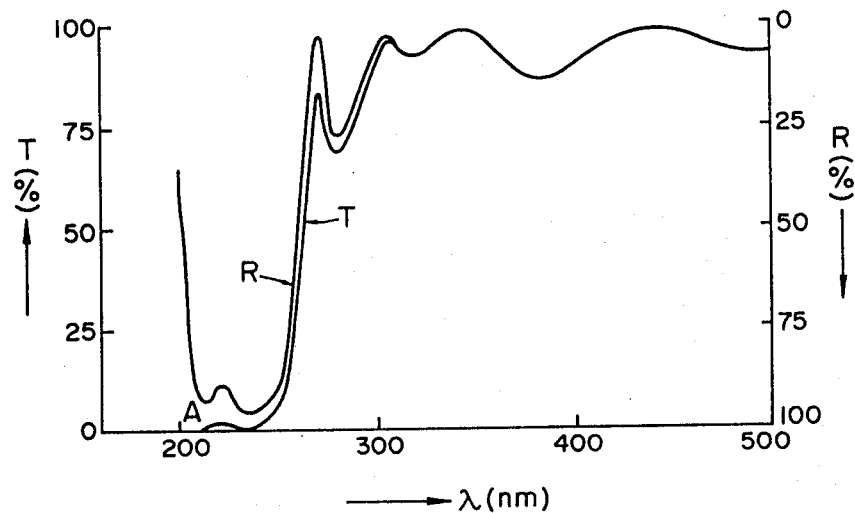

The arrangement of layers in the multilayer film is shown in FIG. 15A and its wavelength characteristic curve is shown in FIG. 15B. As shown in FIG. 15A, the multilayer film was composed of fifteen layers in total of which three were zirconium oxide layers H, five were aluminum oxide layers M and seven were magnesium fluoride layers L. The first layer counted from the side of substrate (quartz) was 40 nm in optical film thickness, the second to sixth layers were 50 nm each in optical film thickness and the seventh to fifteenth layers were 65 nm each in optical film thickness. The optical film thickness was obtained by calculation under the condition that the wavelength of incident beam is 480 nm. The characteristic curve shown in FIG. 15B was obtained with the angle of incidence being 36 degrees. Although not shown in FIG. 15B, the multilayer film has a transmission factor of over 90% even to such beam of light having a wavelength longer than 500 nm.

Compared with a multilayer film comprising only aluminum oxide and magnesium fluoride alternate layers (FIG. 1), the multilayer film of FIG. 15 had about twice as broad a half width and exhibited a high reflection factor with fewer layers. Therefore, this multilayer film according to the invention is easy to manufacture.

Figure 16:
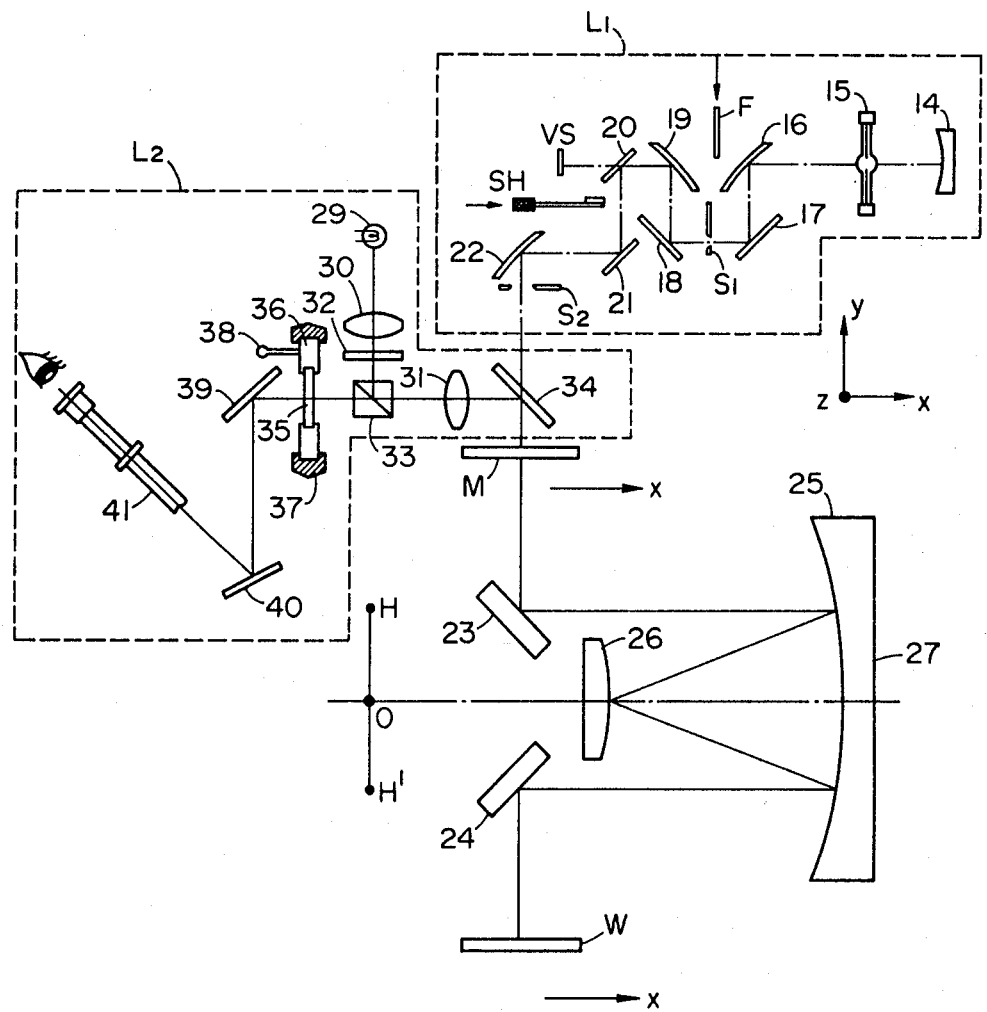
FIGS. 16 and 17 are schematic illustrations of embodiments of a semiconductor printing apparatus to which a multilayer film according to the invention has been applied.

FIG. 16 schematically shows an embodiment of a semiconductor printing apparatus using far ultraviolet rays to which the multilayer film of the invention was applied.

At first, explanation is made of an illumination light generating optical system for printing which is shown enclosed by the broken line $L_1$ in FIG. 16. Designated by 15 is a super high pressure mercury lamp and 14 is a spherical reflection mirror so disposed as to form an image of spot light source in parallel with the spot light source of the mercury lamp. 16 is a web-like telecentric spherical mirror and 17 is a reflection mirror to which a multilayer film according to the invention was applied. The reflection mirror 17 reflects primarily a beam of far ultraviolet light so as to expose a photoresist to it. $S_1$ is a slit plate having therein an arculate opening. An arculate light source image is formed on the surface of the slit plate $s_1$. By changing the length of the opening in radial direction as well as along the arc, the length of an arcuate light source image formed on a mask as later described can be adjusted in the radial direction as well as in the direction along the arc.

F is a printing light cutting filter which is inserted in the surface of the slit plate $S_1$ at the time of mask-wafer alignment. 18 is an ordinary mirror. The multilayer film according to the invention may be applied not to the above described mirror 17 but to this mirror 18; alternatively, 19 is an incidence side web-like telecentric spherical mirror for converting the opening of the slit plate $S_1$ into a spot-like image. 20 is a half mirror and SH is a shutter. The shutter SH is in the plane on which the spot image of slit $S_1$ is formed and when it is wished to stop illuminating the mask the shutter is positioned on the spot image. In a plane conjugate with the position at which the spot image is formed relative to the half mirror there is provided a screen VS. Therefore, on the screen VS there are formed simultaneous light images one of which is an image of the true light source and the other of which is an image of the light source image formed by the spherical mirror 14.

21 is a mirror and 22 is an exit side web-like telecentric spherical mirror. The spherical mirror 22 forms on the mask M an arculate image from the spot-like image once formed by the spherical mirror 19. $S_2$ is a slit plate having therein an arculate opening the function of which is to control the aperture number of the beam of light incident upon the mask M.

The optical system shown enclosed by the broken line $L_2$ in FIG. 16 is a mask/wafer observation system. In the shown position, observation can be carried out through the system. When printing is carried out, the observation system $L_2$ is brought to a position out of the printing light path.

A pattern of mask M is projected on a wafer W through a reflection optical system which comprises plane mirrors 23, 24, concave mirror 25 and convex mirror 26. Both of the curvature centers of concave mirror 25 and convex mirror 26 lie in a point O on the optical axis 27. The plane mirrors 23 and 24 are provided only to deflect the light path and have no effect on image forming ability. Therefore, if the presence of these plane mirrors is ignored, then an object point lying at height H from the point O will form its image at H' symmetrical to H relative to the optical axis without any aberration and at 1:1 magnification. But, since the area in which no aberration occurs is limited only to H and its vicinity, an arc of radius H is used. Through mirrors 23 and 24 the positions of H and H' correspond to mask M and wafer W respectively. By parallel moving of the mask M and wafer W at the same time in the direction of the X-axis in the plane of the drawing while illuminating the mask M in a form of arc by the illumination system 28, the pattern of mask M is printed on the entire surface of wafer W.

Designated by 29 is an illumination light source for inspection which illuminates the surface of mask M through lenses 30 and 31. Half mirror 33, mirror 34 and polarizing plate 32 are so arranged that the light path is deflected toward the mask M and the illumination light to the mask surface M is polarized at 45° with respect to the X-axis. Light specularly reflected upon the backside of the mask M passes through mirror 34, lens 31 and half mirror 33, and then is incident on the polarizing plate. To prevent the incident light from passing through the polarizing plate, the latter is rotated by a rotating mechanism. In the shown embodiment, the rotating mechanism comprises a rotatable holder 36 holding the polarizing plate 35, a securing member 37 and a knob 38. The holder 36 comprises a cylindrical surface which is guided along a guide provided in the securing member and can be rotated with the knob 38.

The above described mirrors 23 and 24 are formed as phase difference reflecting mirrors having a phase difference of $\frac{1}{2}\pi$ produced therebetween. Therefore, the linearly polarized light passed through the mask becomes a circularly polarized light before it reaches the wafer W. The beam of light reflected upon the wafer goes back to the mask M passing again through the reflection optical system (24, 25, 26, 23). However, at this time, the phase difference mirrors 23, 24 again give the predetermined phase difference to the beam so that the beam becomes a linearly polarized beam before it enters the mask M. But, the polarization plane of this beam intersects, at a right angle, the polarization plane of the beam of light coming from the light source and incident upon the mask M. The reflected light from the wafer W also illuminates the mask M and is diffused by the pattern of mask M. This diffused light is in the same polarized state as that of the reflected light from the wafer. Therefore, the reflected light from wafer W and the diffused light from mask M illuminated by the same reflected light pass through mirror 34, lens 31, half mirror 33 and polarizing plate 35. Then, the lights enter an eye-piece 41 through mirrors 39 and 40. Through the eye-piece the operator can observe both the wafer W and mask M for inspection. Mask surface and wafer surface are in a conjugate relation. Therefore, by removing the component of linearly polarized light reflected by the backside of mask M it is possible to observe clear and sharp images of both the wafer surface and mask surface at the same time. Since the images are formed by the light directly reflected upon the mask surface, they have high contrast and are free of flare and the like so that a precise alignment of mask and wafer can be attained by examining the images.

Figure 17:
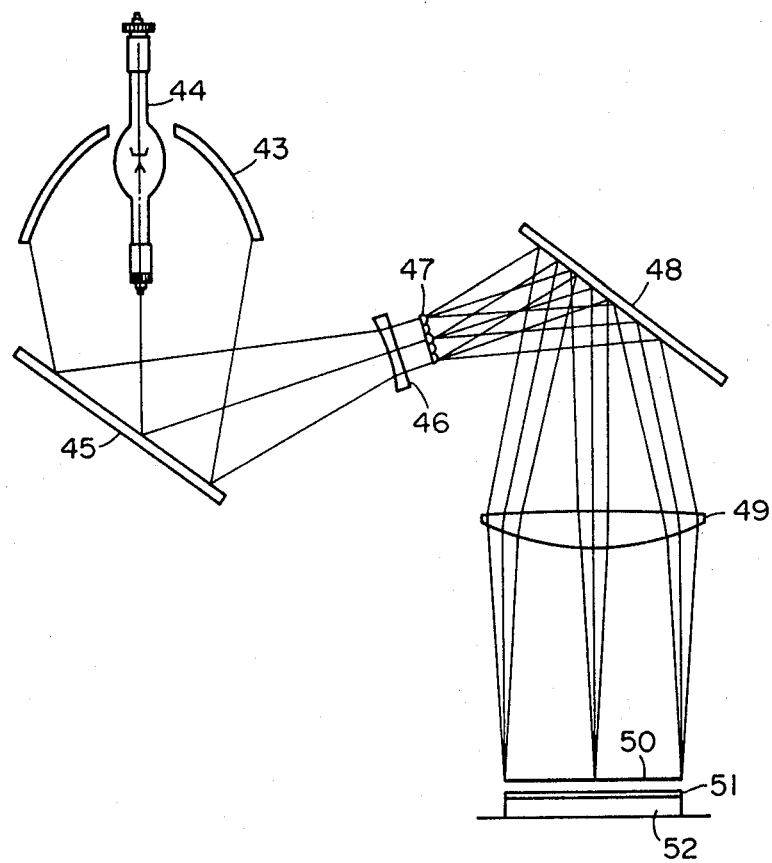

Another embodiment of a semiconductor printing apparatus to which a multilayer film according to the invention was applied is shown in FIG. 17. Details of the optical system shown in FIG. 17 correspond to those disclosed in U.S. Pat. No. 3,988,066 and need not be further described.

In FIG. 17, an ellipsoidal mirror 43 directs the beam of light emitted from a Xe-Hg lamp 44 to a reflection mirror 45. The reflection mirror 45 is formed as a cold mirror to which a multilayer film according to the invention is applied. The cold mirror reflects primarily a beam of far ultraviolet light and transmits lights in other wavelength regions. The reflected beam of far ultraviolet light from the cold mirror enters a fly's eye lens assembly after being collimated by a collimator lens 46. The beam of light emerging from the lens assembly is reflected by a mirror 48 to a condenser lens 49 which concentrates the reflected light on the surface of a photo mask 50. After passing through the photo mask 50, the beam of light is incident upon a photoresist 51 to expose it to light. The photoresist 51 is placed on a semiconductor wafer 52 positioned at a predetermined distance from the mask 50.

In the shown printing apparatus, the multilayer film according to the invention may be applied to any one of mirrors disposed between the light source 44 and photoresist 51. For example, instead of the mirror 45, the mirror 48 may have the multilayer film applied to its surface.

While the invention has been particularly shown and described with reference to preferred embodiments thereof, it will be understood by those skilled in the art that the foregoing and other changes in form and details can be made therein without departing from the spirit and scope of the invention.

What I claim is:

1. An ultraviolet multilayer film which reflects beams of light in the far ultraviolet region but transmits beams of light in other wavelength regions, said ultraviolet multilayer film comprising:
a substrate;
a first group of thin films provided on said substrate and comprising alternate layers of high refractive dielectric having a refractive index not less than 1.9 and low refractive dielectric having a refractive index not more than 1.5; and
a second group of thin films provided on said first group of thin films and comprising alternate layers of intermediate refractive dielectric having a refractive index between 1.5 and 1.9 and low refractive dielectric having a refractive index not more than 1.5;
said refractive indices being determined in the wave length region of 200–300 nm.

2. An ultraviolet multilayer film according to claim 1, wherein the layer in said first group of thin films which is in contact with said substrate is one of said high refractive dielectric layers, the number of layers of said first group is even, and the layer in said second group which is in contact with said first group is one of said intermediate refractive dielectric layers.

3. An ultraviolet multilayer film according to claim 2, wherein the endmost layer in said second group is one of said intermediate refractive dielectric layers.

4. An ultraviolet multilayer film according to claim 1, wherein the layer in said first group of thin films which is in contact with said substrate is one of said high refractive dielectric layers, wherein the number of layers of said first group is odd, and the layer in said second group which is in contact with said first group is one of said low refractive dielectric layers.

5. An ultraviolet multilayer film according to claim 1, wherein the layer in said first group of thin films which is in contact with said substrate is one of said high refractive dielectric layers, wherein the number of layers of said first group is odd, and the layer in said second group which is in contact with said first group is one of said intermediate refractive dielectric layers.

* * * * *

UNITED STATES PATENT OFFICE

CERTIFICATE OF CORRECTION

Patent No. 4,320,936             Dated March 23, 1982

Inventor(s)  MITSUHARU SAWAMURA

It is certified that error appears in the above-identified patent and that said Letters Patent are hereby corrected as shown below:

Column 3, line 35, "magnesium is fluoride used" should read --magnesium fluoride is used--.

Column 4, line 26, after "on" insert --the--;
          line 33, "mn" should read --nm--.

Column 5, line 26, "incubation" should read --calculation--.

Column 5, line 30, "are" should read --being--.

Column 6, line 8, "to" should read --will--; before "larger" insert -- a--.

Column 7, line 59, "such" should read --a--.

Column 8, line 16, "s$_1$" should read --S$_1$--.
          line 35, after "formed" add --two--.

UNITED STATES PATENT OFFICE
CERTIFICATE OF CORRECTION

Patent No. 4,320,936          Dated March 23, 1982

Inventor(s) MITSUHARU SAWAMURA

It is certified that error appears in the above-identified patent and that said Letters Patent are hereby corrected as shown below:

Column 9, line 11, "specularly" should read --regular--;

Signed and Sealed this

Fourteenth Day of December 1982

[SEAL]

Attest:

GERALD J. MOSSINGHOFF

Attesting Officer    Commissioner of Patents and Trademarks